United States Patent
Yu et al.

(10) Patent No.: US 11,768,551 B2
(45) Date of Patent: Sep. 26, 2023

(54) ARRAY SUBSTRATE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Chi Yu, Beijing (CN); Weiyun Huang, Beijing (CN); Xingliang Xiao, Beijing (CN); Chao Zeng, Beijing (CN)

(73) Assignees: CHENGDU BOE OPTOELECTRONICS CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 89 days.

(21) Appl. No.: 17/417,174

(22) PCT Filed: Jan. 20, 2020

(86) PCT No.: PCT/CN2020/073237
§ 371 (c)(1),
(2) Date: Jun. 22, 2021

(87) PCT Pub. No.: WO2021/146842
PCT Pub. Date: Jul. 29, 2021

(65) Prior Publication Data
US 2022/0328568 A1    Oct. 13, 2022

(51) Int. Cl.
*G06F 3/041*    (2006.01)
*G06F 3/044*    (2006.01)
(Continued)

(52) U.S. Cl.
CPC .......... *G06F 3/0412* (2013.01); *G06F 3/0443* (2019.05); *G06F 3/0446* (2019.05);
(Continued)

(58) Field of Classification Search
CPC .... G06F 3/0412; G06F 3/0446; G06F 3/0448; G06F 3/0443; H01L 27/323; H01L 27/3246; H01L 51/5237
(Continued)

(56) References Cited

U.S. PATENT DOCUMENTS 9,608,048 B2    3/2017   Su
9,939,970 B2    4/2018   Zeng et al.
(Continued)

FOREIGN PATENT DOCUMENTS

CN    103823601 A    5/2014
CN    104252276 A    12/2014
(Continued)

OTHER PUBLICATIONS

The International Search Report dated Sep. 28, 2020; Appln. No. PCT/CN2020/082736.
(Continued)

*Primary Examiner* — Prabodh M Dharia

(57) ABSTRACT

An array substrate and a display device are provided. The array substrate includes a base substrate, an anode layer, a packaging layer and a touch electrode layer; the base substrate includes a transparent display region; the anode layer is located on the base substrate and includes a plurality of anodes; the packaging layer is located at a side of the anode layer away from the base substrate; the touch electrode layer is located at a side of the packaging layer away from the anode layer and includes a conductive mesh line, in the transparent display region, an orthographic projection of the conductive mesh line on the base substrate meets or partially overlaps with an orthographic projection of at least one of the plurality of anodes on the base substrate.

20 Claims, 6 Drawing Sheets

(51) Int. Cl.
*H10K 50/84* (2023.01)
*H10K 59/40* (2023.01)
*H10K 59/122* (2023.01)
*H10K 59/12* (2023.01)
*H10K 59/35* (2023.01)

(52) U.S. Cl.
CPC ........... *G06F 3/0448* (2019.05); *H10K 50/84* (2023.02); *H10K 59/122* (2023.02); *H10K 59/40* (2023.02); *G06F 2203/04111* (2013.01); *G06F 2203/04112* (2013.01); *H10K 59/12* (2023.02); *H10K 59/351* (2023.02)

(58) Field of Classification Search
USPC ......................................................... 345/173
See application file for complete search history.

(56) References Cited

U.S. PATENT DOCUMENTS

| | | | |
|---|---|---|---|
| 9,965,111 | B2 | 5/2018 | Wang |
| 10,274,654 | B2 | 4/2019 | Jin et al. |
| 10,719,680 | B2 | 7/2020 | Ye |
| 10,761,629 | B2 | 9/2020 | Wang |
| 11,003,298 | B2 | 5/2021 | Li et al. |
| 11,112,898 | B2 | 9/2021 | Gong et al. |
| 11,424,298 | B2 | 8/2022 | Li et al. |
| 2014/0160373 | A1 | 6/2014 | Hsu et al. |
| 2014/0198268 | A1 | 7/2014 | Sugita et al. |
| 2015/0060120 | A1 | 3/2015 | Park |
| 2016/0011688 | A1 | 1/2016 | Wang |
| 2016/0103519 | A1 | 4/2016 | Jin et al. |
| 2016/0202793 | A1 | 7/2016 | Kim et al. |
| 2017/0040396 | A1* | 2/2017 | Li ................... H01L 27/3246 |
| 2017/0062772 | A1* | 3/2017 | Chu .................. H01L 27/3262 |
| 2017/0154943 | A1* | 6/2017 | Yang ................... H10K 59/123 |
| 2017/0200773 | A1* | 7/2017 | Li .................... H01L 27/3272 |
| 2017/0269728 | A1 | 9/2017 | Donnelly |
| 2018/0089485 | A1 | 3/2018 | Bok |
| 2018/0173346 | A1 | 6/2018 | Du et al. |
| 2018/0219024 | A1* | 8/2018 | Liu ...................... G02F 1/1368 |
| 2019/0004638 | A1 | 1/2019 | Lee et al. |
| 2019/0050104 | A1 | 2/2019 | Na et al. |
| 2019/0123304 | A1* | 4/2019 | Liu ..................... H01L 27/1214 |
| 2019/0140030 | A1 | 5/2019 | Huangfu et al. |
| 2019/0243479 | A1 | 8/2019 | Wang |
| 2019/0258338 | A1 | 8/2019 | Park |
| 2020/0033999 | A1 | 1/2020 | Xie et al. |
| 2020/0042116 | A1 | 2/2020 | Li et al. |
| 2020/0042117 | A1 | 2/2020 | Li |
| 2020/0064958 | A1 | 2/2020 | Jun et al. |
| 2020/0183538 | A1 | 6/2020 | Li et al. |
| 2020/0303467 | A1 | 9/2020 | Feng |
| 2021/0020701 | A1 | 1/2021 | Zheng |
| 2021/0064168 | A1 | 3/2021 | Gong et al. |
| 2021/0081063 | A1 | 3/2021 | Ye |
| 2021/0208739 | A1 | 7/2021 | Li et al. |
| 2021/0376002 | A1 | 12/2021 | Li et al. |
| 2021/0376047 | A1 | 12/2021 | Xue et al. |

FOREIGN PATENT DOCUMENTS

| | | |
|---|---|---|
| CN | 104281351 A | 1/2015 |
| CN | 205355055 U | 6/2016 |
| CN | 105988613 A | 10/2016 |
| CN | 106024840 A | 10/2016 |
| CN | 106406627 A | 2/2017 |
| CN | 107219953 A | 9/2017 |
| CN | 107656646 A | 2/2018 |
| CN | 107946346 A | 4/2018 |
| CN | 108054193 A | 5/2018 |
| CN | 108089759 A | 5/2018 |
| CN | 108183110 A | 6/2018 |
| CN | 108334825 A | 7/2018 |
| CN | 108829283 A | 11/2018 |
| CN | 109213369 A | 1/2019 |
| CN | 109240533 A | 1/2019 |
| CN | 109378316 A | 2/2019 |
| CN | 110023891 A | 7/2019 |
| CN | 110047880 A | 7/2019 |
| CN | 110310977 A | 10/2019 |
| CN | 110634930 A | 12/2019 |
| CN | 110764636 A | 2/2020 |
| EP | 4095922 A1 | 11/2022 |
| JP | 2015064756 A | 4/2015 |
| JP | 2017037386 A | 2/2017 |
| WO | 2019137002 A1 | 7/2019 |
| WO | 2020/020027 A1 | 1/2020 |

OTHER PUBLICATIONS

The Written Opinion of the International Searching Authority dated Sep. 28, 2020; Appln. No. PCT/CN2020/082736.
USPTO NFOA dated Feb. 6, 2023 in connection with U.S. Appl. No. 17/295,685 (U.S. National phase application of PCT/CN2020/082736).
CNIPA 1st Office Action dated Apr. 28, 2023 in connection with CN 202080000457.6 (Chinese National phase application of PCT/CN2020/082736).
The International Search Report dated Oct. 22, 2020; Appln. No. PCT/CN2020/073237 (U.S. National phase U.S. Appl. No. 17/417,174 (also subject application) of PCT/CN2020/073237).
The Written Opinion of the International Searching Authority dated Oct. 22, 2020; Appln. No. PCT/CN2020/073237.
Extended European Search Report and European search opinion dated Feb. 22, 2023; Application No. 20900696.4 (EP counterpart of PCT/CN2020/073237).
The International Search Report dated Jan. 5, 2021; Appln. No. PCT/CN2020/082739.
The Written Opinion of the International Searching Authority dated Jan. 5, 2021; Appln. No. PCT/CN2020/082739.
Extended European Search Report and European search opinion dated Mar. 13, 2023; Application No. 20926362.3 (EP counterpart of PCT/CN2020/082739).
USPTO NFOA dated Apr. 26, 2023 in connection with U.S. Appl. No. 17/427,146 (U.S. National phase application of PCT/CN2020/082739).
The International Search Report dated Jan. 7, 2021; Appln. No. PCT/CN2020/082788.
The Written Opinion of the International Searching Authority dated Jan. 7, 2021; Appln. No. PCT/CN2020/082788.
Extended European Search Report and European search opinion dated Mar. 24, 2023; Application No. 20926367.2 (EP counterpart of PCT/CN2020/082788).
USPTO NFOA dated Apr. 26, 2023 in connection with U.S. Appl. No. 17/427,116 (U.S. National phase application of PCT/CN2020/082788).
The International Search Report dated Jan. 7, 2021; PCT/CN2020/082787.
The Written Opinion of the International Searching Authority dated Jan. 7, 2021; PCT/CN2020/082787.
Extended European Search Report and European search opinion dated Mar. 31, 2023; Application No. 20926366.4 (EP counterpart of PCT/CN2020/082787).
USPTO NFOA dated Feb. 6, 2023 in connection with U.S. Appl. No. 17/295,685.
The International Search Report dated Oct. 22, 2020; Appln. No. PCT/CN2020/073237.
USPTO NFOA dated May 12, 2023 in connection with U.S. Appl. No. 17/427,130.

* cited by examiner

ARRAY SUBSTRATE AND DISPLAY DEVICE

TECHNICAL FIELD

Embodiments of the present disclosure relate to an array substrate and a display device.

BACKGROUND

With the continuous development of display technology, compared with traditional Liquid Crystal Display (LCD) display technology, Organic Light-Emitting Diode (OLED) display technology is widely used in smart electronic products such as smart phones and wearable smart devices because of its advantages of self-illumination, wide color gamut, high contrast and lightness.

At present, intelligent electronic products with a high screen ratio have gradually become the mainstream of the market because of their beautiful appearance and better user experience. With the continuous development of technology and market, intelligent electronic products with high screen ratio design can no longer meet people's needs, and intelligent electronic products with a full screen design have become a development trend in the future.

On the other hand, in order to realize a light and thin design of a display device (for example, an organic light-emitting diode display device), a display panel and a touch structure may be integrated together. Therefore, flexible multiple layer on cell (FMLOC) touch technology came into being. The FMLOC touch technology refers to that directly manufacturing various electrode layers and various wires of a touch structure on the packaging layer, thus integrating the touch structure on the display panel. Therefore, the display device adopting the FMLOC touch technology can not only realize the light and thin design of the display device, but also realize flexible display and flexible touch.

SUMMARY

Embodiments of the present disclosure provide an array substrate and a display device. The array substrate includes a base substrate, an anode layer, a packaging layer and a touch electrode layer; the base substrate includes a transparent display region; the anode layer is on the base substrate and includes a plurality of anodes; the packaging layer is at a side of the anode layer away from the base substrate; and the touch electrode layer is at a side of the packaging layer away from the anode layer and comprises a conductive mesh line, in the transparent display region, an orthographic projection of the conductive mesh line on the base substrate meets or partially overlaps with an orthographic projection of at least one of the plurality of anodes on the base substrate, in this way, the generation of slits between the anode and the conductive mesh lines can be effectively avoided, and a diffraction phenomenon or an interference phenomenon when light passes through the transparent display region can be avoided. Therefore, in the case where the array substrate is applied to a display device, the imaging quality of the camera assembly below the screen can be ensured.

At least one embodiment of the present disclosure provides an array substrate, which includes: a base substrate, comprising a transparent display region; an anode layer, which is on the base substrate and comprises a plurality of anodes; a packaging layer, at a side of the anode layer away from the base substrate; and a touch electrode layer, which is at a side of the packaging layer away from the anode layer and comprises a conductive mesh line, in the transparent display region, an orthographic projection of the conductive mesh line on the base substrate meets or partially overlaps with an orthographic projection of at least one of the plurality of anodes on the base substrate.

For example, in the array substrate provided by an embodiment of the present disclosure, in the transparent display region, the orthographic projection of the conductive mesh line on the base substrate has an overlapping region with the orthographic projection of at least one of the plurality of anodes on the base substrate, and a width of the overlapping region ranges from 0 to 3.5 microns.

For example, in the array substrate provided by an embodiment of the present disclosure, in the transparent display region, the orthographic projection of the conductive mesh line on the base substrate meets or partially overlaps with the orthographic projection of each of the plurality of anodes on the base substrate.

For example, in the array substrate provided by an embodiment of the present disclosure, in the transparent display region, the conductive mesh line is disposed along an edge of a corresponding anode of the plurality of anodes.

For example, in the array substrate provided by an embodiment of the present disclosure, the base substrate further comprises a non-transparent display region, and the plurality of anodes comprise a plurality of anode groups, a density of anode groups in the non-transparent display region is greater than a density of anode groups in the transparent display region, and the transparent display region comprises an anode region and a transparent region, wherein the anode region is provided with at least one of the plurality of anode groups, and the transparent region is provided with no anode group.

For example, in the array substrate provided by an embodiment of the present disclosure, each of the plurality of anode groups comprises one first anode, two second anodes and one third anode, in the transparent display region, the orthographic projection of the conductive mesh line on the base substrate meets or partially overlaps with orthographic projections of the first anode, the second anode and the third anode in the each of the plurality of anode groups on the base substrate.

For example, in the array substrate provided by an embodiment of the present disclosure, in the transparent display region, the conductive mesh line comprises a first conductive line in the anode region and a second conductive line in the transparent region, and the first conductive line constitutes a first mesh that meets or partially overlaps with each anode in each of the plurality of anode groups.

For example, in the array substrate provided by an embodiment of the present disclosure, the second conductive line is formed as a straight line connecting two adjacent first conductive lines.

For example, in the array substrate provided by an embodiment of the present disclosure, the second conductive line is formed as a second mesh connecting two adjacent first conductive lines.

For example, in the array substrate provided by an embodiment of the present disclosure, the touch electrode layer comprises a plurality of metal mesh electrodes, the conductive mesh line comprises a metal mesh line, and the metal mesh line constitutes the plurality of metal mesh electrodes.

For example, in the array substrate provided by an embodiment of the present disclosure, a line width of the conductive mesh line ranges from 2 microns to 5 microns, and a size of each of the plurality of anodes ranges from 10 microns to 80 microns.

For example, the array substrate provided by an embodiment of the present disclosure further includes: a pixel definition layer on a side of the anode layer away from the base substrate and comprises a plurality of openings which are in one-to-one correspondence with the plurality of anodes, in the transparent display region, the orthographic projection of the conductive mesh line on the base substrate falls within an orthographic projection of the pixel definition layer on the base substrate, and is spaced apart from an orthographic projection of edges of the plurality of opening on the base substrate.

For example, in the array substrate provided by an embodiment of the present disclosure, in the non-transparent display region, the conductive mesh line meets or partially overlaps with at least one of the plurality of anodes.

For example, in the array substrate provided by an embodiment of the present disclosure, in the non-transparent display region, the conductive mesh line is between two adjacent anodes of the plurality of anodes, and is arranged at an interval respectively with the two adjacent anodes.

For example, the array substrate provided by an embodiment of the present disclosure further comprising: a pixel drive layer between the base substrate and the anode layer; a planarization layer between the pixel drive layer and the anode layer; a light-emitting layer at a side of the anode layer away from the planarization layer; and a cathode layer between the light-emitting layer and the packaging layer.

For example, the array substrate provided by an embodiment of the present disclosure further includes: an optical function assembly configured to receive or emit light, wherein the optical function assembly is at a side of the base substrate away from the anode layer, and is in the transparent display region.

For example, in the array substrate provided by an embodiment of the present disclosure, the optical function assembly comprises at least one selected from the group consisting of a camera assembly, a face recognition assembly and an optical fingerprint recognition assembly.

At least one embodiment of the present disclosure further provides a display device comprising the array substrate as described above.

For example, the display device provided by an embodiment of the present disclosure further includes an optical function assembly configured to receive or emit light, the optical function assembly is at a side of the base substrate away from the anode layer, and is in the transparent display region.

At least one embodiment of the present disclosure further provides an array substrate, which includes: a base substrate comprising a transparent display region; an anode layer on the base substrate and comprises a plurality of anodes; a packaging layer at a side of the anode layer away from the base substrate; and a touch electrode layer which is at a side of the packaging layer away from the anode layer and comprises a conductive mesh line, the transparent display region comprises an anode region and a transparent region, the anode region is provided with at least one anode of the plurality of anodes, and the transparent region is provided with no anode, and in the transparent display region, the conductive mesh line comprises a first conductive line in the anode region and a second conductive line in the transparent region, and the second conductive line is formed as a non-mesh line connecting two adjacent first conductive lines.

For example, in the array substrate provided by an embodiment of the present disclosure, the second conductive line is formed as a straight line connecting two adjacent first conductive lines.

For example, in the array substrate provided by an embodiment of the present disclosure, the first conductive line constitutes a first mesh meeting or partially overlapping with at least one anode of the plurality of anodes.

For example, in the array substrate provided by an embodiment of the present disclosure, the first conductive line is between two adjacent anodes of the plurality of anodes and is respectively spaced apart from the two adjacent anodes.

BRIEF DESCRIPTION OF THE DRAWINGS

In order to more clearly illustrate the technical solution of the embodiments of the present disclosure, the drawings of the embodiments will be briefly described in the following. It is obvious that the described drawings below are only related to some embodiments of the present disclosure without constituting any limitation thereto.

DETAILED DESCRIPTION

In order to make objectives, technical details and advantages of the embodiments of the present disclosure more clearly, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment (s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "include," "including," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly.

In order to further improve the screen ratio and achieve a full screen design, a camera assembly may be set below the screen. However, the inventor of the present application found that in a display device adopting FMLOC technology, because metal mesh lines are arranged between two adjacent anodes, both the metal mesh lines and the anodes are non-transparent structures, thus forming a slit between the metal mesh lines and the two adjacent anodes; when visible light passes through the slit, diffraction or interference easily occurs, which leads to poor imaging quality of the camera assembly below.

Figure 1:
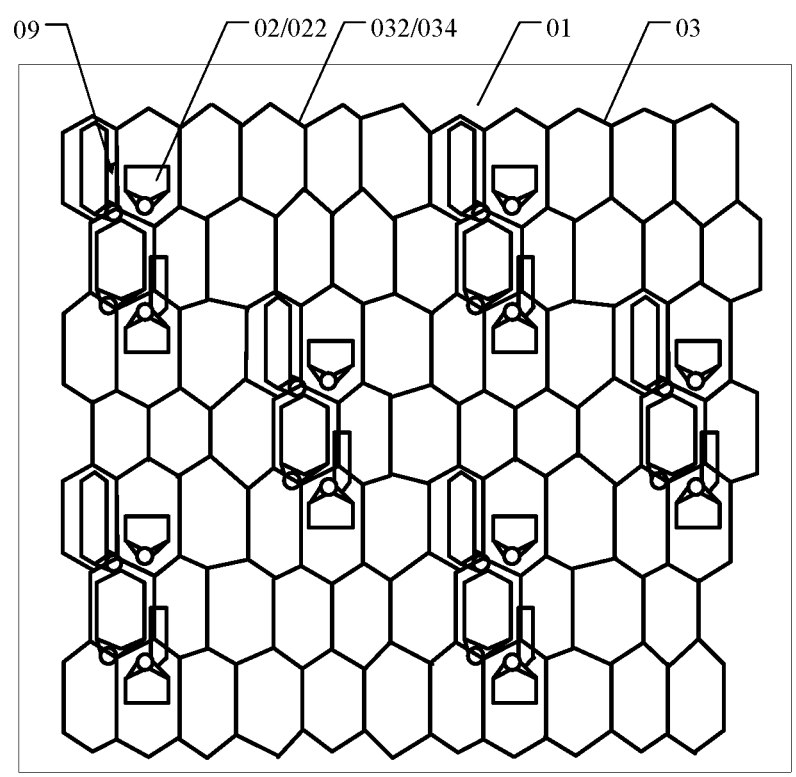
FIG. 1 shows a schematic planar view of an array substrate.

For example, FIG. 1 shows a schematic planar view of an array substrate; as illustrated in FIG. 1, the array substrate includes a base substrate 01, an anode layer 02 and a touch electrode layer 03; the anode layer 02 is disposed on the base substrate 01, and the touch electrode layer 03 is disposed on a side of the anode layer 02 away from the base substrate 01. An insulation layer or a passivation layer (not illustrated) is further provided between the anode layer 02 and the touch electrode layer 03. The anode layer 02 includes a plurality of anodes 022; the touch electrode layer 03 includes a metal mesh electrode 032, the metal mesh electrode 032 is constituted by metal mesh lines 034. A part of the metal mesh lines 034 is arranged between two adjacent anodes 022, and both the metal mesh lines 034 and the anodes 022 are non-transparent structures, thus forming at least one slit 09 between metal mesh lines 034 and the two adjacent anodes 022; when visible light passes through the slit 09, diffraction or interference occur easily, which results in poor imaging quality of a camera assembly below the screen. In this regard, the inventor of the present application thought of optimizing the design of the metal mesh lines, so as to avoid the generation of the above-mentioned slit and ensure the imaging quality of the camera assembly below the screen.

At least one embodiment of the present disclosure provides an array substrate and a display device. The array substrate includes a base substrate, an anode layer, a packaging layer and a touch electrode layer; the base substrate includes a transparent display region; the anode layer is on the base substrate and includes a plurality of anodes; the packaging layer is at a side of the anode layer away from the base substrate; and the touch electrode layer is at a side of the packaging layer away from the anode layer and comprises a conductive mesh line, in the transparent display region, an orthographic projection of the conductive mesh line on the base substrate meets or partially overlaps with an orthographic projection of at least one of the plurality of anodes on the base substrate, in this way, the generation of slits between the anode and the conductive mesh lines can be effectively avoided, and a diffraction phenomenon or an interference phenomenon when light passes through the transparent display region can be avoided. Therefore, in the case where the array substrate is applied to a display device, the imaging quality of the camera assembly below the screen can be ensured.

Next, the array substrate and the display device provided by embodiments of the present disclosure are described in detail with reference to the drawings.

Figure 2:
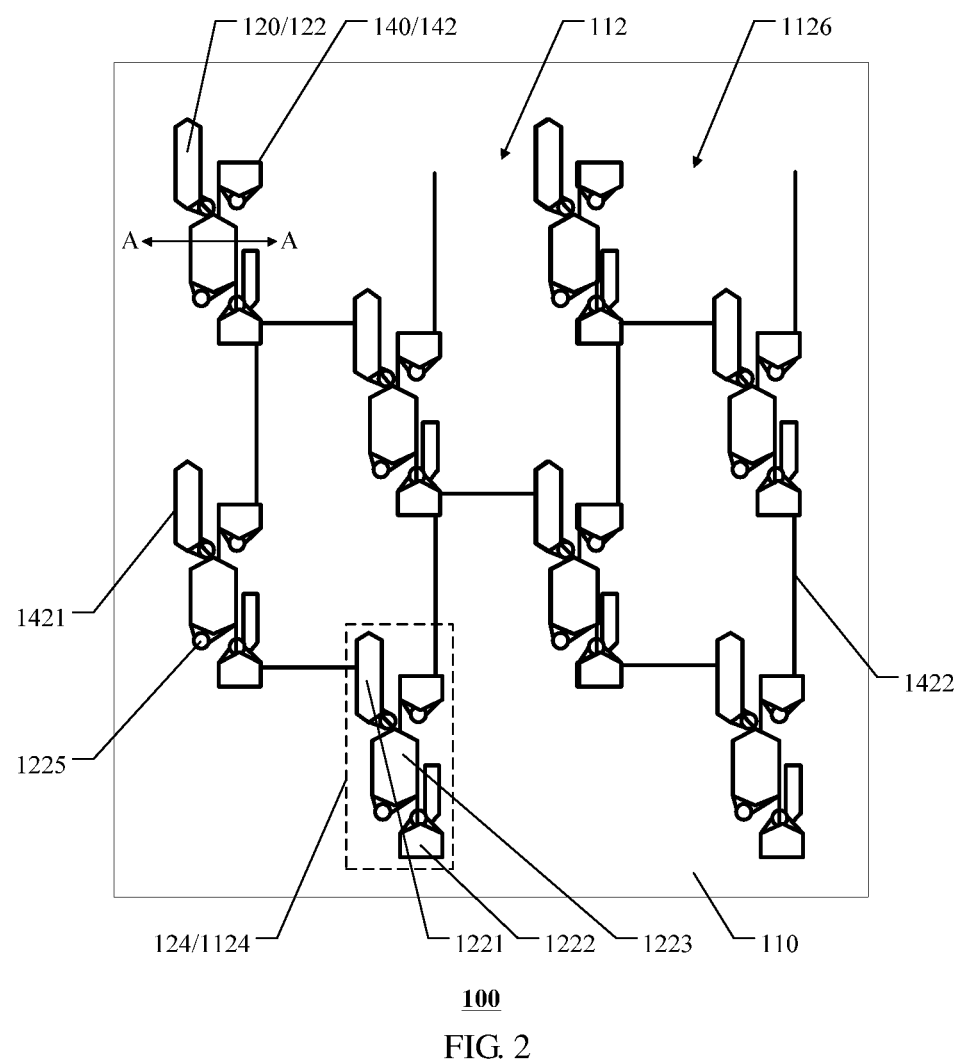
FIG. 2 is a schematic planar view of an array substrate provided by an embodiment of the present disclosure.

FIG. 2 is a schematic planar view of an array substrate provided by an embodiment of the present disclosure. As illustrated in FIG. 2, the array substrate 100 includes a base substrate 110, an anode layer 120, a packaging layer (not illustrated in FIG. 2) and a touch electrode layer 140; the base substrate 110 includes a transparent display region 112; the anode layer 120 is located on the base substrate 110 and includes a plurality of anodes 122; the packaging layer is located at a side of the anode layer 120 away from the base substrate 110; the touch electrode layer 140 is located at a side of the packaging layer away from the anode layer 120 and includes a conductive mesh line(s) 142. Within the transparent display region 112, an orthographic projection of the conductive mesh line 142 on the base substrate 110 meets or partially overlaps with an orthographic projection of at least one of the plurality of anodes 122 on the base substrate 110. It should be noted that the above-mentioned feature "an orthographic projection of the conductive mesh line 142 on the base substrate 110 meets an orthographic projection of at least one of the plurality of anodes 122 on the base substrate 110" means that there is no gap between the edges respectively of the two orthographic projections, that is, a distance between the edges respectively of the two orthographic projections is equal to zero; the above-mentioned feature "an orthographic projection of the conductive mesh line 142 on the base substrate 110 partially overlaps with an orthographic projection of at least one of the plurality of anodes 122 on the base substrate 110" means that the two orthographic projections have overlapping regions that overlap with each other.

In the array substrate provide by at least one embodiment of the present disclosure, because the orthographic projection of the conductive mesh line(s) on the base substrate meets or partially overlapped with the orthographic projection of at least one of the plurality of anodes on the base substrate, the generation of a slit between the anode and the conductive mesh line can be effectively avoid, and thus a diffraction phenomena or the interference phenomena when light passes through the transparent display region can be avoided. Therefore, in the case where the array substrate is applied to a display device, the functions of an optical function assembly located in the transparent display region can be guaranteed to be unaffected. For example, in the case where the optical function assembly is a camera assembly, the array substrate can ensure the imaging quality of the camera assembly. For another example, in the case where the optical function assembly is an optical fingerprint recognition assembly, the array substrate can ensure the fingerprint recognition accuracy of the optical fingerprint recognition assembly. It should be noted that although the array substrate illustrated in FIG. 1 adopts a pixel arrangement of GGRB, the array substrate provided by the embodiment of the present disclosure can also adopt other modes of pixel arrangements, and the conductive mesh lines can also be set according to the specific pixel arrangement. In some examples, as illustrated in FIG. 2, within the transparent display region 112, the orthographic projection of the conductive mesh line(s) 142 on the base substrate 110 meets or partially overlaps with the orthographic projection of each of the plurality of anodes 122 on the base substrate 110. With this arrangement, on the one hand, it is ensured that no slit is formed between the anode and the conductive mesh line(s), and on the other hand, the distribution density of the conductive mesh line is increased, thereby reducing the touch blind region, increasing the touch accuracy and reducing the overall resistance of the conductive mesh line.

In some examples, as illustrated in FIG. 2, within the transparent display region 112, the conductive mesh line 142 is disposed along the edges of the corresponding anode 122. With this arrangement, the conductive mesh line may surround all the edges of the anode, thereby further ensuring that no slit is formed between the anode and the conductive mesh line, and increasing the distribution density of the conductive mesh line.

It is worth noting that a general planar shape of the anode is not regular hexagon or pentagon, but includes a main body configured to drive a light-emitting layer to emit light and a connection portion connected with the drive circuit through a via hole (for example, a convex portion 1225 at the edge of the anode as illustrated in FIG. 2). In the array substrate provided by at least one embodiment of the present disclosure, the conductive mesh line is arranged along or around the main body of the anode, but is not around the connection portion of the anode. Therefore, the orthographic projection of the conductive mesh line on the base substrate meet or partially overlaps with the orthographic projection of a part of the edges of at least one anode on the base substrate, but not necessarily all the edges of the at least one anode.

Figure 3:
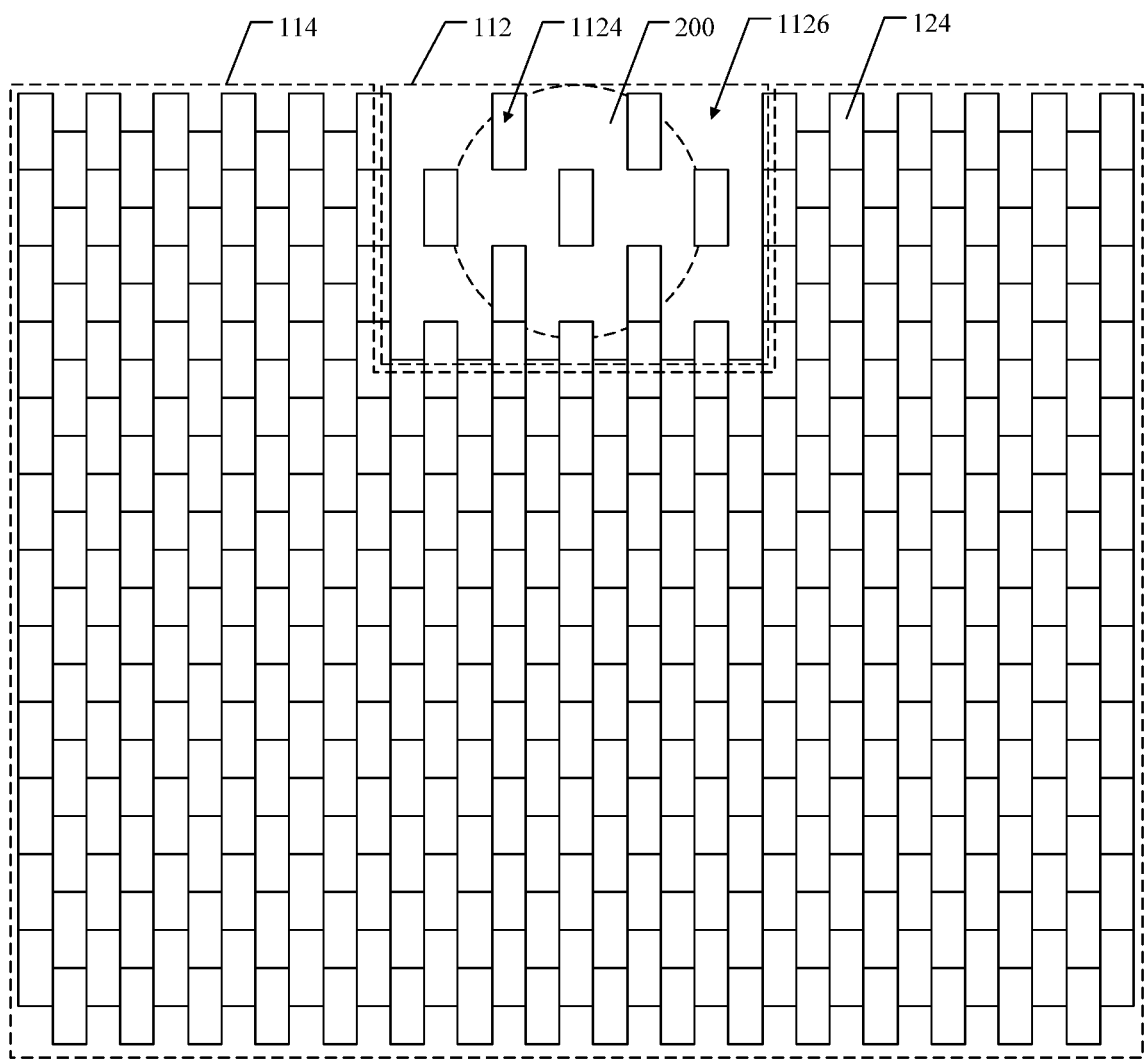
FIG. 3 is another schematic planar view of the array substrate provided by an embodiment of the present disclosure.

FIG. 3 is a schematic planar view of the array substrate provided by an embodiment of the present disclosure. As illustrated in FIG. 3, the base substrate 110 further includes a non-transparent display region 114; as illustrated in FIG. 2 and FIG. 3, the plurality of anodes 122 includes a plurality of anode groups 124, that is, the plurality of anodes 122 are divided into the plurality of anode groups 124; the density of the anode groups 124 in non-transparent display region 114 is greater than that of the anode group 124 in the transparent display region 112. The transparent display region 112 includes an anode region 1124 and a transparent region 1126, the anode region 1124 is provided with at least one anode group 124 and the transparent region 1126 is provided with no anode group 124. With this arrangement, the array substrate has both the transparent display region 112 and the non-transparent display region 114, the transparent display region 112 can display and may be provided with the optical function assembly, and the non-transparent display region 114 can display with a high resolution. Therefore, in the case where the array substrate is applied to a display device, the array substrate can realize a full screen design and has a high-quality display image. Of course, the embodiments of the present disclosure include but are not limited to this, and the base substrate may only include the transparent display region, but include no non-transparent display region; in this case, the optical function assembly may be arranged under all the display region of the array substrate.

It should be noted that in order to concisely show the difference between transparent display region and non-transparent display region, each small rectangle in FIG. 3 represents an anode group; in addition, the anodes mentioned above may be configured to drive the light-emitting layer to emit light of a single color, so as to correspond to sub-pixels in the display device. The anode group may include a plurality of anodes which respectively drive different light-emitting layers to emit light of different colors, so as to correspond to pixels in the display device.

In some examples, as illustrated in FIG. 2 and FIG. 3, the anode group 124 includes one first anode 1221, two second anodes 1222 and one third anode 1223; in the transparent display region 112, the orthographic projections of the conductive mesh lines 142 on the base substrate 110 meet or partially overlap with an orthographic projection of the first anode 1221 in the anode group 124 on the base substrate 110, an orthographic projection of the second anode 1222 in the anode group 124 on the base substrate 110 and an orthographic projection of the third anode 1223 in the anode group 124 on the base substrate 110. With this arrangement, on the one hand, it can ensure that no slits are formed between the conductive mesh lines and any one selected from the group consisting of the first anode, the second anode and the third anode, and on the other hand, the distribution density of the conductive mesh lines can be increased, thus reducing the touch blind region, increasing the touch accuracy and reducing the overall resistance of the conductive mesh lines.

For example, the first anode may be the anode of a first color subpixel, the second anode may be the anode of a second color subpixel, and the third anode may be the anode of a third color subpixel. For example, the first color subpixel is a red subpixel, the second color subpixel is a green subpixel, and the third color subpixel is a blue subpixel. Of course, the embodiments of the present disclosure include but are not limited to this, and the above three color sub-pixels may also be sub-pixels of other colors.

In some examples, as illustrated in FIG. 2, within the transparent display region 112, the conductive mesh line 142 includes a first conductive line(s) 1421 located in the anode region 1124 and a second conductive line 1422 located in the transparent region 1126, and the first conductive line 1421 constitutes a first mesh that meets or partially overlaps with each anode 122 in the anode group 124. With this arrangement, because the anode is not arranged in the transparent region, the slit cannot be formed between the second conductive line and the anode; and the first conductive line constitute the first mesh which meets or partially overlaps with each anode in the anode group, so that the formation of the slits between the anode and the first conductive lines can be effectively avoided, and thus the diffraction phenomena or the interference phenomena can be avoided when light passes through the anode region.

In some examples, as illustrated in FIG. 2, the second conductive line 1422 is formed as a non-mesh line connecting two adjacent first conductive lines 1421, such as a straight line. Because there is no anode in the transparent region, the opening ratio of the transparent region can be increased by setting the second conductive line as a straight line, so that the amount of light transmitted through the transparent region can be increased, and the performance and accuracy of the optical function assembly arranged in the transparent display region can be improved. In addition, by setting the second conductive line as a straight line, the risk of diffraction at a chamfer of the anode can also be reduced.

In some examples, within the non-transparent display region, the conductive mesh lines meet or partially overlap with at least one of the plurality of anodes. That is, in the non-transparent display region, the conductive mesh lines may adopt the same arrangement as the conductive mesh lines in the transparent display region; for example, the specific shape and position of the conductive mesh lines in the non-transparent display region may be referred to those of the first conductive lines in FIG. 2. Of course, the implementation of the present disclosure includes but is not limited to this, and the conductive mesh lines in the non-transparent display region can also be located between two adjacent anodes and respectively spaced apart from the two adjacent anodes.

In some examples, the touch electrode layer 140 includes a plurality of metal mesh electrodes, the conductive mesh line 142 includes a metal mesh line, and the metal mesh line 142 constitutes the metal mesh electrodes mentioned above. That is, the above-mentioned touch electrode layer is constituted by the metal meshes.

Figure 4:
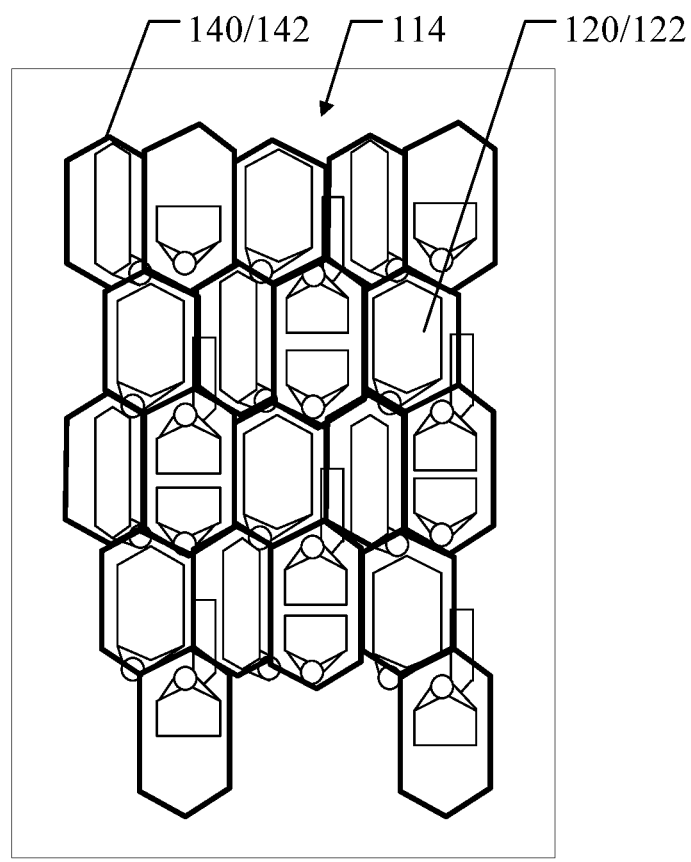
FIG. 4 is further another schematic planar view of the array substrate provided by an embodiment of the present disclosure.

FIG. 4 is another schematic planar view of the array substrate provided by an embodiment of the present disclosure. As illustrated in FIG. 4, within the non-transparent display region 114, the conductive mesh line 142 is located between two adjacent anodes 122 and spaced apart from the two adjacent anodes 122. Because the non-transparent display region does not need to transmit light, the slits formed between the conductive mesh line and two adjacent anodes cannot result in the above-mentioned problem caused by diffraction or interference.

Figure 5:
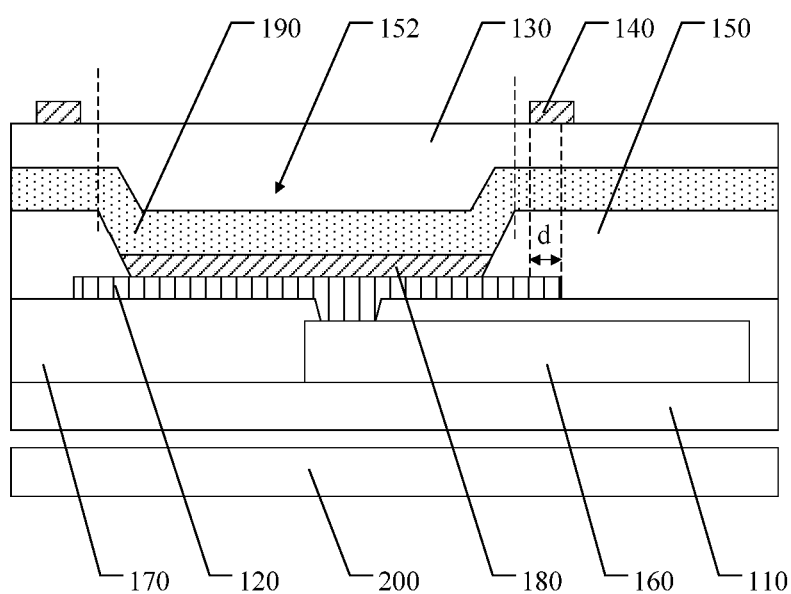
FIG. 5 is a schematic cross-sectional view of the array substrate provided by an embodiment of the present disclosure taken along the AA direction in FIG. 2.

FIG. 5 is a schematic cross-sectional view of the array substrate provided by the embodiment of the present disclosure taken along the AA direction in FIG. 2. As illustrated in FIG. 5, the array substrate 100 includes the base substrate 110, the anode layer 120, the packaging layer 130 and the touch electrode layer 140. In addition, the array substrate 100 further includes a pixel definition layer 150. The pixel definition layer 150 is located at the side of the anode layer 120 away from the base substrate 110, and includes a plurality of openings 152, and the plurality of openings 152 are in one-to-one correspondence with the plurality of anodes 122. Within the transparent display region 112, the orthographic projection of the conductive mesh line 142 on the base substrate 110 falls within the orthographic projection of the pixel definition layer 150 on the base substrate 110, and is spaced apart from the orthographic projection of the edge of the respective opening 152 on the base substrate 110. That is, there is a certain distance between the conductive mesh line and the edge of the respective opening, so as to prevent the conductive mesh line from influencing the luminous angle, thus ensuring a certain opening viewing angle. In some examples, as illustrated in FIG. 5, within the transparent display region 112, the orthographic projection of the conductive mesh line 142 on the base substrate 110 has an overlapping region with the orthographic projection of at least one of the plurality of anodes 122 on the base substrate 110, and the width d of the overlapping region ranges from 0 to 3.5 microns. With this arrangement, under a condition of certain process error, it is ensured that no slit is formed between the anode and the conductive mesh line, thus further effectively avoiding the diffraction phenomenon or the interference phenomenon when light passes through the transparent display region.

In some examples, the line width of the conductive mesh line ranges from 2 microns to 5 microns, and the size of each anode ranges from 10 microns to 80 microns.

In some examples, as illustrated in FIG. 5, the array substrate 100 further includes a pixel drive layer 160, a planarization layer 170, a light-emitting layer 180 and a cathode layer 190. The pixel drive layer 160 is located between the base substrate 110 and the anode layer 120, the planarization layer 170 is located between the pixel drive layer 160 and the anode layer 120, the light-emitting layer 180 is located at a side of the anode layer 120 away from planarization layer 170, and cathode layer 190 is located between light-emitting layer 180 and packaging layer 130. It should be noted that the array substrate may further include other layer structures for realizing the display function, such as a hole injection layer, a hole transport layer, an electron injection layer and an electron transport layer, etc., and no limitation is imposed to this in embodiments of the present disclosure.

In some examples, as illustrated in FIG. 5, the array substrate 100 further includes an optical function assembly 200 configured to receive or emit light, and the optical function assembly 200 is at a side of the base substrate 110 away from the anode layer 120 and falls within the transparent display region 112. With this arrangement, light can enter the optical function assembly through the transparent display region of the base substrate, or light emitted by the optical function assembly can be emitted out through the transparent display region of the base substrate. Therefore, the array substrate can realize functions corresponding to the optical function assembly while displaying.

For example, the optical function assembly 200 includes at least one selected from the group consisting of a camera assembly, a face recognition assembly and an optical fingerprint recognition assembly, so that at least one of a camera function and a fingerprint recognition function can be realized. It should be noted that the above-mentioned face recognition assembly may include an ambient light sensor, a distance sensor, an infrared lens, a flood camera, a dot matrix projector, and the like. Of course, embodiments of the present disclosure include but are not limited to this, and the above-mentioned face recognition assembly may also include other function components.

For example, the above-mentioned base substrate is a transparent substrate, such as a glass substrate, a quartz substrate, a plastic substrate, and the like. In addition, the base substrate may be a flexible transparent substrate, for example, a polyimide (PI) substrate. Embodiments of that present disclosure include but are not limited to this.

For example, the above-mentioned anode layer may be made of a metal material, and the touch electrode layer may also be made of a metal material.

For example, the above-mentioned packaging layer may include a laminated structure of an organic packaging layer and an inorganic packaging layer; the material of the inorganic packaging layer may be one or more selected from the group consisting of silicon oxide, silicon nitride or silicon oxynitride; the material of the organic packaging layer may be organic resin, polyimide, or polyacrylate, etc. Of course, embodiments of the present disclosure include but are not limited to this.

For example, the above pixel drive layer may include a pixel drive circuit, and the pixel drive circuit provided by the embodiments of the present disclosure may refer to the usual design; for example, the pixel drive circuit may further include a thin film transistor, a capacitor and other structures, and the embodiments of the present disclosure are not described in detail here.

Figure 6:
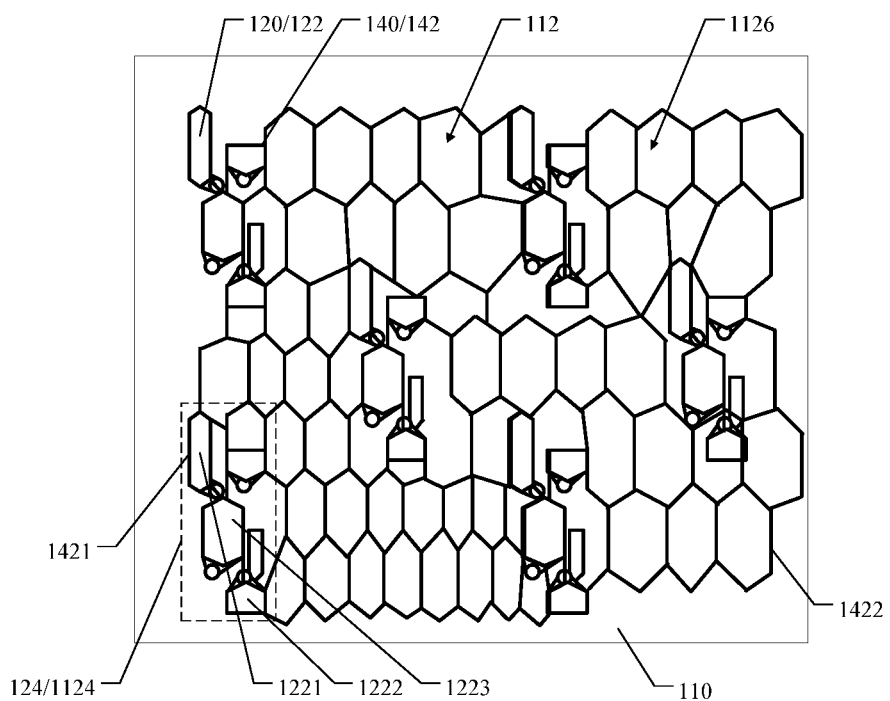
FIG. 6 is further another schematic planar view of the array substrate provided by an embodiment of the present disclosure.

FIG. 6 is another schematic planar view of the array substrate provided by an embodiment of the present disclosure. As illustrated in FIG. 6, the array substrate 100 includes a base substrate 110, an anode layer 120, a packaging layer 130 and a touch electrode layer 140. The base substrate 110 includes a transparent display region 112; the anode layer 120 is located on the base substrate 110 and includes a plurality of anodes 122; the packaging layer 130 is located at a side of the anode layer 120 away from the base substrate 110. The touch electrode layer 140 is located at a side of the packaging layer 130 away from the anode layer 120 and includes a conductive mesh line 142. The transparent display region 112 includes an anode region 1124 and a transparent region 1126, the anode region 1124 is provided with at least one anode group 124 and the transparent region 1126 is provided with no anode group 124. Within the transparent display region 112, the conductive mesh line 142 includes a first conductive line 1421 located in the anode region 1124 and a second conductive line 1422 located in the transparent region 1126. The first conductive line 1421 constitutes a first mesh which meets or partially overlaps with each anode 122 in the anode group 124, and the second conductive line 1422 is formed as a second mesh connecting two adjacent first conductive lines 1421. With this arrangement, because the anode is not arranged in the transparent region, a slit between the second conductive line and the anode cannot be formed; and the first conductive line constitutes the first mesh which meets or partially overlaps with each anode in the anode group, so that the generation of slits between the anode and the first conductive line can be effectively avoided, and thus the diffraction phenomena or the interference phenomena can be avoided when light passes through the anode region.

Figure 7:
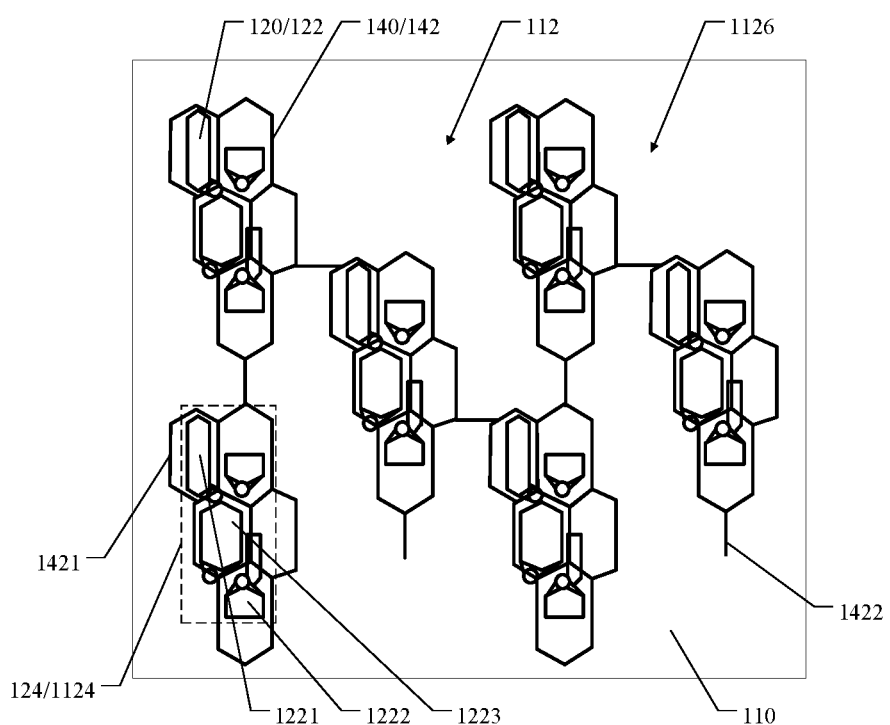
FIG. 7 is further another schematic planar view of the array substrate provided by an embodiment of the present disclosure.

FIG. 7 is another schematic planar view of the array substrate provided by an embodiment of the present disclosure. As illustrated in FIG. 7, the array substrate 100 includes a base substrate 110, an anode layer 120, a packaging layer 130 and a touch electrode layer 140. The base substrate 110 includes a transparent display region 112; the anode layer 120 is located on the base substrate 110 and includes a plurality of anodes 122; the packaging layer 130 is located at a side of the anode layer 120 away from the base substrate 110. The touch electrode layer 140 is located at a side of the packaging layer 130 away from the anode layer 120 and includes a conductive mesh line 142. The transparent display region 112 includes an anode region 1124 and a transparent region 1126, the anode region 1124 is provided with at least one anode group 124 and the transparent region 1126 is provided with no anode group 124. Within the transparent display region 112, the conductive mesh line 142 includes a first conductive line 1421 located in the anode region 1124 and a second conductive line 1422 located in the transparent region 1126. The second conductive line 1422 is formed as a non-mesh line connecting two adjacent first conductive lines 1421, such as a straight line or a bent line. With this arrangement, because there is no anode in the transparent region, the aperture ratio of the transparent region can be increased by setting the second conductive line as the non-mesh line, thereby increasing the amount of light transmitted through the transparent region and improving the performance and the accuracy of the optical function assembly arranged in the transparent display region.

In some examples, as illustrated in FIG. 7, the second conductive line 1422 is formed as a straight line connecting two adjacent first conductive lines 1421. By setting the second conductive line as a straight line, the aperture ratio of the transparent region can be further increased, so that the amount of light transmitted through the transparent region can be improved, and the performance and the accuracy of the optical function assembly arranged in the transparent display region can be improved. In some examples, the first conductive line 1421 is located between two adjacent anodes 122 and is spaced apart from the two adjacent anodes 122. That is, the first conductive line 1421 does not adopt the related arrangement of the first conductive line in the embodiment illustrated in FIG. 2. Of course, the embodiments of the present disclosure include but are not limited to this, and the first conductive line may constitute a first mesh that meets or partially overlaps with each anode in the anode group, so as to avoid the first conductive line from forming a slit with the adjacent anode, and for details, please refer to the related description of the embodiment illustrated in FIG. 2.

Figure 8:
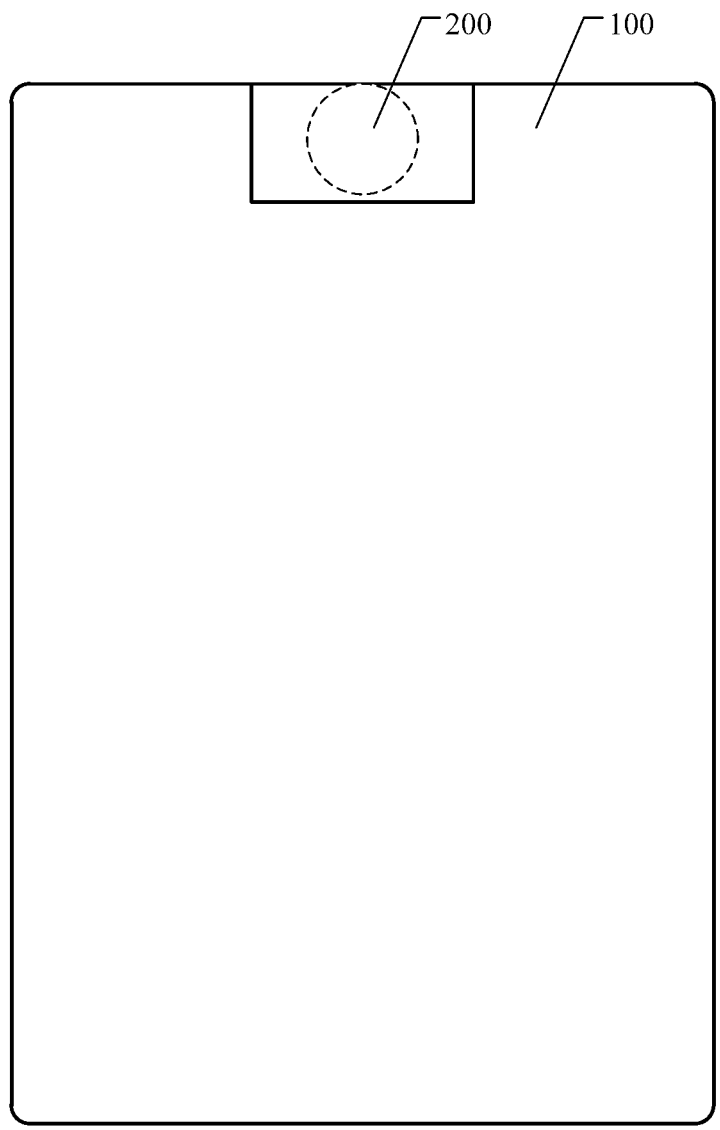
FIG. 8 is a schematic diagram of a display device provided by an embodiment of the present disclosure.

FIG. 8 is a schematic diagram of a display device provided by an embodiment of the present disclosure. As illustrated in FIG. 8, the display device 300 includes the array substrate 100 provided by any one of the above embodiments. Therefore, the display device can effectively avoid forming slits between the anode and the conductive mesh line(s), thereby avoiding the diffraction phenomena or the interference phenomena when light passes through the transparent display region. Therefore, the display device can ensure that the functions of the optical function assembly located in the transparent display region are not affected. For example, in the case where the optical function assembly is a camera assembly, the display device can ensure the imaging quality of the camera assembly; for another example, in the case where the optical function assembly is an optical fingerprint recognition assembly, the display device can ensure the accuracy of the fingerprint recognition performed by the optical fingerprint recognition assembly. Or, the display device can increase the aperture ratio of the transparent region by setting the second conductive line as a straight line, so as to increase the amount of light transmitted through the transparent region, thereby improving the performance and the accuracy of the optical function assembly arranged in the transparent display region.

In some examples, as illustrated in FIG. 8, the display device 300 further includes an optical function assembly 200 configured to receive or emit light, and the optical function assembly 200 is located at the side of the base substrate 110 away from the anode layer 120 and falls within the transparent display region 112. With this arrangement, light can enter the optical function assembly through the transparent display region of the base substrate, or light emitted by the optical function assembly can be emitted out through the transparent display region of the base substrate. Therefore, the array substrate can realize functions corresponding to optical function assembly while displaying.

For example, the optical function assembly 200 includes at least one selected from the group consisting of a camera assembly, a face recognition assembly, a face recognition assembly and an optical fingerprint recognition assembly, so that at least one of a camera function and a fingerprint recognition function can be realized.

For example, the display device may be a smart display device, such as a smart phone, a tablet computer, a smart watch, and the like. Of course, the embodiments of this disclosure include but are not limited to this, and the display device may be any products or components with a display function, such as digital cameras, large-area curtain walls, advertising screens, televisions, monitors, laptops, digital photo frames, navigators, etc.

The following statements need to be explained:

(1) In the drawings of the embodiments of the present disclosure, only the structures related to the embodiments of the present disclosure are involved, and other structures may refer to the common design(s).

(2) In case of no conflict, features in one embodiment or in different embodiments of the present disclosure can be combined.

The above are merely particular embodiments of the present disclosure but are not limitative to the scope of the present disclosure; any of those skilled familiar with the related arts can easily conceive variations and substitutions in the technical scopes disclosed by the present disclosure, which should be encompassed in protection scopes of the present disclosure. Therefore, the scopes of the present disclosure should be defined in the appended claims.

What is claimed is:

1. An array substrate, comprising:
    a base substrate, comprising a transparent display region;
    an anode layer, which is on the base substrate and comprises a plurality of anodes;
    a packaging layer, at a side of the anode layer away from the base substrate; and
    a touch electrode layer, which is at a side of the packaging layer away from the anode layer and comprises a conductive mesh line, wherein, in the transparent display region, an orthographic projection of the conductive mesh line on the base substrate meets or partially overlaps with an orthographic projection of at least one of the plurality of anodes on the base substrate.

2. The array substrate according to claim 1, wherein, in the transparent display region, the orthographic projection of the conductive mesh line on the base substrate has an overlapping region with the orthographic projection of at least one of the plurality of anodes on the base substrate, and a width of the overlapping region ranges from 0 to 3.5 microns.

3. The array substrate according to claim 1, wherein, in the transparent display region, the orthographic projection of the conductive mesh line on the base substrate meets or partially overlaps with the orthographic projection of each of the plurality of anodes on the base substrate.

4. The array substrate according to claim 1, wherein, in the transparent display region, the conductive mesh line is disposed along an edge of a corresponding anode of the plurality of anodes.

5. The array substrate according to claim 1, wherein the base substrate further comprises a non-transparent display region, and the plurality of anodes comprise a plurality of anode groups,
a density of anode groups in the non-transparent display region is greater than a density of anode groups in the transparent display region, and the transparent display region comprises an anode region and a transparent region, wherein the anode region is provided with at least one of the plurality of anode groups, and the transparent region is provided with no anode group.

6. The array substrate according to claim 5, wherein each of the plurality of anode groups comprises one first anode, two second anodes and one third anode,
in the transparent display region, the orthographic projection of the conductive mesh line on the base substrate meets or partially overlaps with orthographic projections of the first anode, the second anode and the third anode in the each of the plurality of anode groups on the base substrate.

7. The array substrate according to claim 5, wherein, in the transparent display region, the conductive mesh line comprises a first conductive line in the anode region and a second conductive line in the transparent region, and the first conductive line constitutes a first mesh that meets or partially overlaps with each anode in each of the plurality of anode groups.

8. The array substrate according to claim 7, wherein the second conductive line is formed as a straight line or a second mesh connecting two adjacent first conductive lines.

9. The array substrate according to claim 5, wherein, in the non-transparent display region,
the conductive mesh line meets or partially overlaps with at least one of the plurality of anodes.

10. The array substrate according to claim 5, wherein, in the non-transparent display region, the conductive mesh line is between two adjacent anodes of the plurality of anodes, and is arranged at an interval respectively with the two adjacent anodes.

11. The array substrate according to claim 1, wherein the touch electrode layer comprises a plurality of metal mesh electrodes, the conductive mesh line comprises a metal mesh line, and the metal mesh line constitutes the plurality of metal mesh electrodes.

12. The array substrate according to claim 1, wherein a line width of the conductive mesh line ranges from 2 microns to 5 microns, and a size of each of the plurality of anodes ranges from 10 microns to 80 microns.

13. The array substrate according to claim 1, further comprising:
a pixel definition layer on a side of the anode layer away from the base substrate and comprises a plurality of openings which are in one-to-one correspondence with the plurality of anodes,
wherein, in the transparent display region, the orthographic projection of the conductive mesh line on the base substrate falls within an orthographic projection of the pixel definition layer on the base substrate, and is spaced apart from an orthographic projection of edges of the plurality of opening on the base substrate.

14. The array substrate according to claim 1, further comprising:
a pixel drive layer between the base substrate and the anode layer;
a planarization layer between the pixel drive layer and the anode layer;
a light-emitting layer at a side of the anode layer away from the planarization layer; and
a cathode layer between the light-emitting layer and the packaging layer.

15. The array substrate according to claim 1, further comprising:
an optical function assembly configured to receive or emit light,
wherein the optical function assembly is at a side of the base substrate away from the anode layer, and is in the transparent display region.

16. A display device comprising the array substrate according to claim 1.

17. The display device according to claim 16, further comprising:
an optical function assembly configured to receive or emit light,
wherein the optical function assembly is at a side of the base substrate away from the anode layer, and is in the transparent display region.

18. An array substrate, comprising:
a base substrate comprising a transparent display region;
an anode layer on the base substrate and comprises a plurality of anodes;
a packaging layer at a side of the anode layer away from the base substrate; and
a touch electrode layer which is at a side of the packaging layer away from the anode layer and comprises a conductive mesh line,
wherein the transparent display region comprises an anode region and a transparent region, the anode region is provided with at least one anode of the plurality of anodes, and the transparent region is provided with no anode, and
in the transparent display region, the conductive mesh line comprises a first conductive line in the anode region and a second conductive line in the transparent region, and the second conductive line is formed as a non-mesh line connecting two adjacent first conductive lines.

19. The array substrate according to claim 18, wherein the first conductive line is formed as a first mesh meeting or partially overlapping with at least one anode of the plurality of anodes.

20. The array substrate according to claim 18, wherein the first conductive line is between two adjacent anodes of the plurality of anodes and is respectively spaced apart from the two adjacent anodes.

* * * * *